US 010598810B2

(12) United States Patent
Mandviwala et al.

(10) Patent No.: US 10,598,810 B2
(45) Date of Patent: Mar. 24, 2020

(54) OPTICAL MAGNETIC FIELD SENSOR UNITS FOR A DOWNHOLE ENVIRONMENT (71) Applicant: HALLIBURTON ENERGY SERVICES, INC., Houston, TX (US)

(72) Inventors: Tasneem A. Mandviwala, Katy, TX (US); Glenn A. Wilson, Singapore (SG); Ahmed Fouda, Houston, TX (US); Burkay Donderici, Houston, TX (US); Etienne Samson, Cypress, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 0 days.

(21) Appl. No.: 15/312,051

(22) PCT Filed: May 19, 2014

(86) PCT No.: PCT/US2014/038552
§ 371 (c)(1),
(2) Date: Nov. 17, 2016

(87) PCT Pub. No.: WO2015/178878
PCT Pub. Date: Nov. 26, 2015

(65) Prior Publication Data
US 2017/0082770 A1   Mar. 23, 2017

(51) Int. Cl.
*G01V 3/26* (2006.01)
*G01V 3/18* (2006.01)
(Continued)

(52) U.S. Cl.
CPC .............. *G01V 3/26* (2013.01); *E21B 47/011* (2013.01); *E21B 47/0905* (2013.01);
(Continued)

(58) Field of Classification Search
CPC ... G01V 3/18; G01V 3/20; G01V 3/22; G01V 3/24; G01V 3/26; G01V 3/28; G01V 3/30;
(Continued)

(56) References Cited

U.S. PATENT DOCUMENTS 5,132,624 A * 7/1992 Kitson .................. E21B 17/028
324/339
5,455,573 A * 10/1995 Delatorre .............. E21B 17/028
166/250.11
(Continued)

FOREIGN PATENT DOCUMENTS

KR    20100115306 A  * 10/2010
WO    2015/178876       11/2015
WO    2015/178878       11/2015

OTHER PUBLICATIONS

Special Metals, www.specialmetals.com, Inconel alloy 718, 28 pages (Year: 2007).*
(Continued)

*Primary Examiner* — David M Schindler
(74) *Attorney, Agent, or Firm* — Gilliam IP PLLC (57) ABSTRACT

A magnetic field sensor unit for a downhole environment includes an optical fiber, a magnetic field sensor, and an optical transducer. The sensor unit also includes a sealed housing that encloses the magnetic field sensor and the optical transducer. The optical transducer is configured to generate a light beam or to modulate a source light beam in the optical fiber in response to a magnetic field sensed by the magnetic field sensor. Related magnetic field measurement methods and systems deploy one or more of such magnetic field sensor units in a downhole environment to obtain magnetic field measurements due to an emitted electromagnetic field.

16 Claims, 5 Drawing Sheets (51) Int. Cl.
| | | |
|---|---|---|
| *E21B 47/09* | (2012.01) | |
| *E21B 47/01* | (2012.01) | |
| *E21B 47/10* | (2012.01) | |
| *E21B 49/00* | (2006.01) | |
| *G01R 33/032* | (2006.01) | |
| *E21B 47/12* | (2012.01) | |

(52) U.S. Cl.
CPC .............. *E21B 47/10* (2013.01); *E21B 49/00* (2013.01); *G01R 33/032* (2013.01); *G01V 3/18* (2013.01); *E21B 47/12* (2013.01)

(58) Field of Classification Search
CPC ... G01V 3/40; G01V 8/00; G01V 8/02; G01V 8/12; G01V 8/14; G01V 8/16; G01V 8/18; G01V 8/20; G01V 8/22; G01V 8/24; G01V 8/26; E21B 47/0905; E21B 47/10; E21B 47/011; E21B 47/12; E21B 49/00; G01R 33/032
See application file for complete search history.

(56) References Cited

U.S. PATENT DOCUMENTS

| | | | |
|---|---|---|---|
| 5,677,631 | A * | 10/1997 | Reittinger ............. E21B 47/102 324/324 |
| 5,804,736 | A | 9/1998 | Klauder et al. |
| 6,534,986 | B2 | 3/2003 | Nichols |
| 6,739,165 | B1 | 5/2004 | Strack et al. |
| 7,077,200 | B1 | 7/2006 | Adnan et al. |
| 9,651,706 | B2 | 5/2017 | Mandviwala et al. |
| 2003/0038634 | A1* | 2/2003 | Strack .................... G01V 11/00 324/323 |
| 2003/0205083 | A1* | 11/2003 | Tubel ....................... E21B 23/03 73/152.19 |
| 2004/0117119 | A1 | 6/2004 | West et al. |
| 2010/0224362 | A1 | 9/2010 | Carazzone |
| 2010/0271030 | A1 | 10/2010 | Reiderman et al. |
| 2011/0139447 | A1 | 6/2011 | Ramos et al. |
| 2011/0290992 | A1* | 12/2011 | Sato .......................... G01V 8/02 250/253 |
| 2012/0223221 | A1* | 9/2012 | Jones ...................... B82Y 15/00 250/269.1 |
| 2013/0056197 | A1 | 3/2013 | Maida et al. |
| 2013/0127471 | A1 | 5/2013 | Sudow et al. |
| 2013/0249705 | A1 | 9/2013 | Sharp et al. |
| 2013/0279841 | A1 | 10/2013 | Joinson |
| 2013/0342210 | A1* | 12/2013 | Stokely .................. G01R 33/26 324/346 |
| 2014/0097848 | A1* | 4/2014 | LeBlanc ................. E21B 47/06 324/338 |
| 2014/0174191 | A1* | 6/2014 | Mason .................... E21B 23/00 73/779 |
| 2014/0175271 | A1* | 6/2014 | Samson ................ E21B 47/123 250/264 |
| 2014/0191761 | A1 | 7/2014 | San Martin et al. |
| 2015/0177411 | A1* | 6/2015 | Childers .................. G01V 8/16 250/269.1 |
| 2016/0334534 | A1 | 11/2016 | Mandviwala et al. |
| 2017/0123096 | A1 | 5/2017 | Wilson et al. |

OTHER PUBLICATIONS

"U.S. Final Office Action", dated Jan. 24, 2017, U.S. Appl. No. 13/756,601, "Distributed Feedback Fiber Laser Strain Sensor Systems and Methods for Subsurface EM Field Monitoring," filed Feb. 1, 2013, 29 pgs.

PCT International Search Report and Written Opinion, dated Feb. 4, 2015, Appl No. PCT/US2014/038542, "A Magnetic Induction Sensor with an Electro-Optical Transducer and Related Methods and Systems," Filed May 19, 2014, 17 pgs.

PCT International Preliminary Report on Patentability, dated Aug. 14, 2015, Appl No. PCT/US2014/038542, "A Magnetic Induction Sensor with an Electro-Optical Transducer and Related Methods and Systems," Filed May 19, 2014, 16 pgs.

PCT International Search Report and Written Opinion, dated Feb. 17, 2015, Appl No. PCT/US2014/038552, "Optical Magnetic Field Sensor Units for a Downhole Environment," filed May 19, 2015, 15 pgs.

Wilt, M.J., et al., "Crosswell Electromagnetic Tomography: System Design Considerations and Field Results," Geophysics, vol. 60, No. 3 (May-Jun. 1995), p. 871-885.

Tumanski, Slawomir, "Induction coil sensors—a review", Institute of Physics Publishing, Measurement Science and Technology. 18 (2007) R31-R46, 17 pgs.

Vohra, S. T. et al., "Fiber-Optic ac electric-field sensor based on the electrostrictive effect," Optic Letters, vol. 17, No. 5, Mar. 1, 1992, 3 pgs.

Chuprin, Andrei et al., "Quantifying factors affecting repeatability in CSEM surveying for reservoir appraisal and monitoring," SEG Las Vegas 2008 Annual Meeting, p. 648-652.

Holten, T. et al., "Time lapse CSEM measurements for reservoir monitoring using a vertical receiver-transmitter setup", 2011 SEG San Antonio 2011 Annual Meeting, pp. 697-701.

Black, Noel et al., "3D inversion of time-lapse CSEM data based on dynamic reservoir simulations of the Harding field, North Sea", 2011 SEG San Antonio 2011 Annual Meeting, pp. 2417-2421.

Colombo, Daniele et al., "Quantifying Surface-to-Reservoir Electromagnetics for Waterflood Monitoring in a Saudi Arabian Carbonate Reservoir," Geophysics, 78(6) E281-E297, 2013.

Hibbs, A D. et al., "Advances in Electromagnetic Survey Instrumentation and the Use of a Cased Borehole for Imaging a Deep Formations", 76th EAGE Conference & Exhibition 2014 Amsterdam RAI, The Netherlands, Jun. 16-19, 2014, 3 pgs.

Hibbs, Andrew et al., "New Electromagnetic Sensors for Magnetotelluric and Induced Polarization Geophysical Surveys," SEG Annual Meeting, Expanded Abstracts, 2012, 5 pgs.

Liang, Lin et al., "Joint Inversion of Controlled-Source Electromagnetic and Production Data for Reservoir Monitoring," Geophysics 77 (5), 2012, p. ID9-ID22.

Maas, Steve et al., "A Fiber Optic Multi-Component Seismic Acquisition System for Permanent Reservoir Monitoring," Presented at 2008 SPE Asia Pacific Oil and Gas Conference, SPE 115185, 7 pgs.

Marsala, Alberto F. et al., "First Borehole to Surface Electromagnetic Survey in KSA: Reservoir Mapping and Monitoring at a New Scale," SPE 146348, 2011, 9 pgs.

Orange, Arnold et al., "The Feasibility of Reservoir Monitoring Using Time-Lapse Marine CSEM," Geophysics, 74 (2), 2009, pp. F21-F29.

Tondel, Richard et al., "Remote Reservoir Monitoring in Oil Sands: From Feasibility Study to Baseline Datasets," CSEG-CSPG-CWLS GeoConvention, Expanded Abstracts, 2013, 5 pgs.

Marsala, Alberto F. et al., "Fluid Distribution Inter-Well Mapping in Multiple Reservoirs by Innovative Borehole to Surface Electromagnetic: Survey Design and Field Acquisition," IPTC 17045, International Petroleum Technology Conference held in Beijing, China, Mar. 26-28, 2013, 4 pgs.

Tseng, H.W. et al., "A Borehole-to-Surface Electromagnetic Survey," Geophysics, 63(5), 1565-1572, 1998.

* cited by examiner

OPTICAL MAGNETIC FIELD SENSOR UNITS FOR A DOWNHOLE ENVIRONMENT

BACKGROUND

During oil and gas exploration and production, many types of information are collected and analyzed. The information is used to determine the quantity and quality of hydrocarbons in a reservoir, and to develop or modify strategies for hydrocarbon production. One technique for collecting relevant information involves monitoring electromagnetic (EM) fields.

Magnetic field sensors typically consist of wire coils and their related circuitry to measure the voltage induced in the wire coils by a time-varying magnetic flux density. The measured voltages are then communicated to a recording unit and/or central processing unit via an electrical telemetry system, which may employ one or more stages of signal amplification. While the sensors themselves can be designed with passive electronic components, the telemetry and amplification components require electrical power. In a downhole environment, this is not desirable.

BRIEF DESCRIPTION OF THE DRAWINGS

Accordingly, there are disclosed in the drawings and the following description options for optical magnetic field sensor units suitable for a downhole environment along with related methods and systems. In the drawings.

It should be understood, however, that the specific embodiments given in the drawings and detailed description do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Disclosed herein are optical magnetic field sensor unit options suitable for a downhole environment. Optical magnetic field sensor units obviate or reduce the need for downhole electronic components. An example optical magnetic field sensor unit design includes a magnetic field sensor and an optical transducer to generate a light beam or to modulate a source light beam in presence of a magnetic field. In a downhole environment, such sensor units are exposed to high-pressure high-temperature (HPHT) conditions that may negatively affect their operation and/or durability.

Accordingly, in at least some embodiments, an optical magnetic field sensor unit includes a housing that surrounds the magnetic field sensor and optical transducer. Further, the housing may be sealed and filled with a fluid. The fluid may be non-magnetic, electrically insulting, and chemically inert. Further, the fluid may be non-compressible. Further, the fluid may enhance the magnetic flux density inside the housing in presence of a magnetic field. Further, the housing is compliant with at least one of a predetermined temperature criterion, a predetermined pressure criterion, a predetermined corrosion resistance criterion, a predetermined size criterion, and a predetermined electromagnetic transmissibility criterion. Various other optical magnetic field sensor unit options and related monitoring methods and systems are described herein.

In some embodiments, a plurality of such optical magnetic field sensor units are deployed along an optical fiber. The deployment of such optical magnetic field sensor units may occur, for example, during logging-while drilling (LWD) operations, wireline logging operations, and/or permanent well installations (e.g., production wells, injection wells, or monitoring wells). Magnetic field measurements collected from optical magnetic field sensor units are stored and processed to generate, for example, a formation parameter log or related image.

Figure 1A:
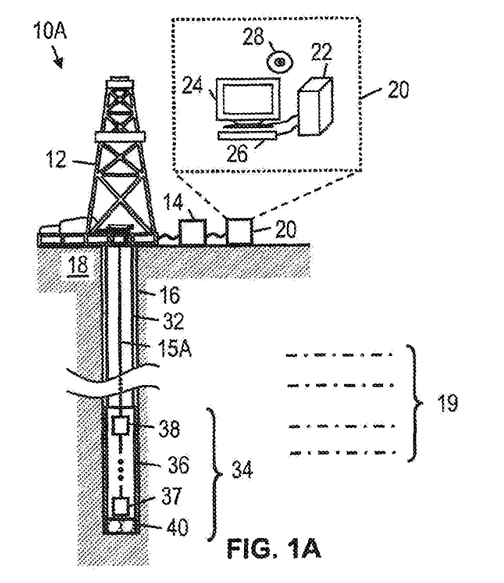
FIGS. 1A-1D depict various illustrative magnetic field survey environments.

To provide some context for the disclosure, FIGS. 1A-1D show illustrative magnetic field survey environments including LWD, wireline logging, permanent well installations, and cross-well environments. FIG. 1A shows an illustrative LWD survey environment 10A. In FIG. 1A, a drilling assembly 12 enables a wired drill string 32 to be lowered and raised in a borehole 16 that penetrates formations 19 of the earth 18. At the lower end of the wired drill string 32, a bottomhole assembly 34 with a drill bit 40 removes material and penetrates formations 19 using known drilling techniques. The bottomhole assembly 34 also includes a logging tool 36 with optical magnetic field sensor unit(s) 38 and electromagnetic (EM) source(s) 37 to obtain magnetic field measurements. Additionally or alternatively, optical magnetic field sensor unit(s) 38 monitor ambient magnetic fields rather than those emitted from EM source(s) 37. The logging tool 36 may also include electronics for data storage, communication, etc. The magnetic field measurements obtained by optical magnetic field sensor unit(s) 38 are conveyed to earth's surface and/or are stored by the logging tool 36. In either case, magnetic field measurements as a function of position and/or time may be analyzed to determine properties of formations 19. For example, the magnetic field measurements may be used to derive a permeability log as a function of position, to track movement of downhole fluids, and/or monitor other formation properties. The logs and/or formation properties may be displayed to an operator.

In FIG. 1A, a cable 15A is represented. The cable 15A may take different forms (e.g., a tubing encapsulated cable) and includes embedded electrical conductors and/or optical waveguides (e.g., fibers) to enable interrogation or monitoring of optical magnetic field sensor units 38. Further, the cable 15A may enable transfer of power and/or communications between the bottomhole assembly 34 and earth's surface. For example, the EM source(s) 37 may be controlled and powered via the cable 15A. The cable 15A may be integrated with, attached to, or inside the drill string 32. In at least some embodiments, cable 15A may be supplemented by or replaced at least in part by mud pulse telemetry or other wireless communication techniques.

In FIG. 1A, an interface 14 at earth's surface receives the magnetic field measurements via cable 15A or another telemetry channel and conveys the magnetic field measurements to a computer system 20. In some embodiments, the surface interface 14 and/or the computer system 20 may perform various operations such as converting received signals from one format to another, storing the magnetic field measurements, processing the measurements, deriving logs from the measurements, and/or displaying logs or other measurement data. In at least some embodiments, the computer system 20 includes a processing unit 22 that performs magnetic field measurement analysis operations by executing software or instructions obtained from a local or remote non-transitory computer-readable medium 28. The computer system 20 also may include input device(s) 26 (e.g., a keyboard, mouse, touchpad, etc.) and output device(s) 24 (e.g., a monitor, printer, etc.). Such input device(s) 26 and/or output device(s) 24 provide a user interface that enables an operator to interact with the logging tool 36 and/or software executed by the processing unit 22. For example, the computer system 20 may enable an operator may select magnetic field measurement analysis options, to view collected measurements, to view analysis results, and/or to perform other tasks.

Figure 1B:
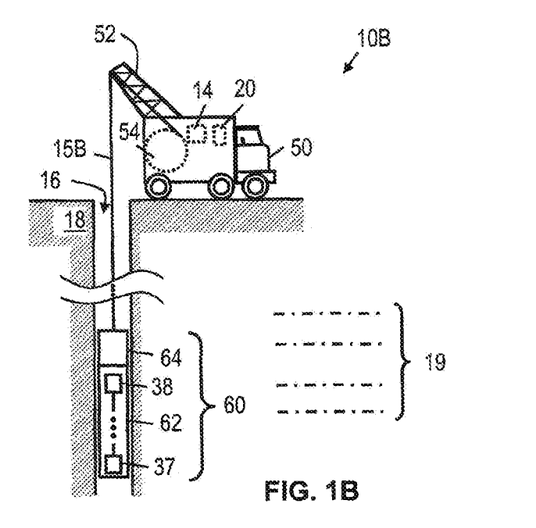

At various times during the drilling process, the drill string 32 shown in FIG. 1A may be removed from the borehole 16. With the drill string 32 removed, wireline logging operations may be performed as shown in the wireline logging survey environment 10B of FIG. 1B. In FIG. 1B, a wireline logging string 60 is suspended in borehole 16 that penetrates formations 19 of the earth 18. For example, the wireline logging string 60 may be suspended by a cable 15B having conductors and/or optical fibers for conveying power to the wireline logging string 60. The cable 15B may also be used as a communication interface for uphole and/or downhole communications. For example, the EM source(s) 37 may be controlled and powered via the cable 15B. Further, the cable 15B enables monitoring or interrogation of the optical magnetic field sensor units 38. In at least some embodiments, the cable 15B wraps and unwraps as needed around cable reel 54 when lowering or raising the wireline logging string 60. As shown, the cable reel 54 may be part of a movable logging facility or vehicle 50 having a cable guide 52.

The wireline logging string 60 includes logging tool(s) 64 and a logging tool 62 with optical magnetic field sensor unit(s) 38 and EM source(s) 37 to obtain magnetic field measurements. The logging tool 62 may also include electronics for data storage, communication, etc. The magnetic field measurements obtained by optical magnetic field sensor unit(s) 38 are conveyed to earth's surface and/or are stored by the logging tool 62. As previously noted, magnetic field measurements as a function of position or time may be analyzed to determine formation properties as described herein. At earth's surface, a surface interface 14 receives the magnetic field measurements via the cable 15B and conveys the magnetic field measurements to a computer system 20 for analysis.

Figure 1C:
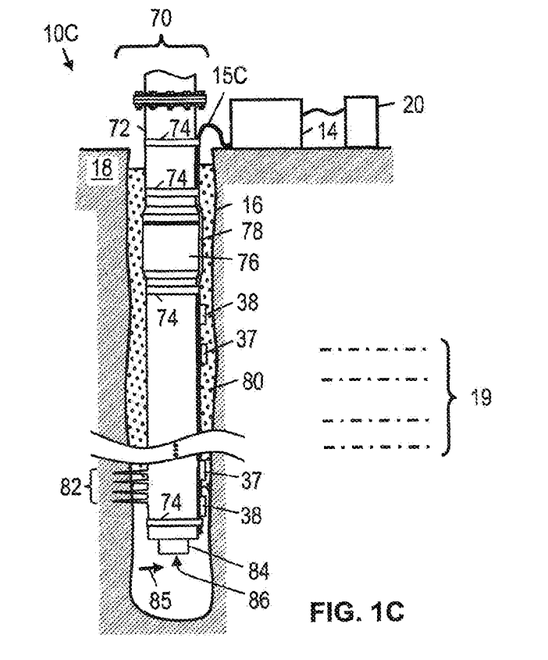

FIG. 1C shows a permanent well survey environment 10C, where well 70 is equipped with optical magnetic field sensor units 38 and EM sources 37 to obtain magnetic field measurements. In the permanent well survey environment 10C, a drilling rig has been used to drill borehole 16 that penetrates formations 19 of the earth 18 in a typical manner (see e.g., FIG. 1A). Further, a casing string 72 is positioned in the borehole 16. The casing string 72 of well 70 includes multiple tubular casing sections (usually about 30 feet long) connected end-to-end by couplings 76. It should be noted that FIG. 1C is not to scale, and that casing string 72 typically includes many such couplings 76. Further, the well 70 includes cement slurry 80 that has been injected into the annular space between the outer surface of the casing string 72 and the inner surface of the borehole 16 and allowed to set. Further, a production tubing string 84 has been positioned in an inner bore of the casing string 72.

In FIG. 1C, the well 70 corresponds to a production well and is adapted to guide a desired fluid (e.g., oil or gas) from a bottom of the borehole 16 to a surface of the earth 18. Accordingly, perforations 82 may be formed at the bottom of the borehole 16 to facilitate the flow of a fluid 85 from a surrounding formation into the borehole 16 and thence to earth's surface via an opening 86 at the bottom of the production tubing string 84. Note that well configuration of FIG. 1C is illustrative and not limiting on the scope of the disclosure. Other examples of permanent well installations include injection wells and monitoring wells.

In the embodiment of FIG. 1C, a cable 15C having electrical conductors and/or optical fibers is used to enable monitoring or interrogation of the optical magnetic field sensor units 38. Further, the EM source(s) 37 may be controlled and powered via the cable 15C. As shown, the cable 15C extends along an outer surface of the casing string 72 and is held against the outer surface of the casing string 72 at spaced apart locations by multiple bands 74 that extend around the casing string 72. A protective covering 78 may be installed over the cable 15C at each of the couplings 76 of the casing string 72 to prevent the cable 15C from being pinched or sheared by the coupling's contact with the borehole wall. The protective covering 78 may be held in place, for example, by two of the bands 74 installed on either side of coupling 76. In at least some embodiments, the cable 15C terminates at surface interface 14, which conveys magnetic field measurements obtained from one or more of the optical magnetic field sensor units 38 to a computer system 20 for analysis.

Figure 1D:
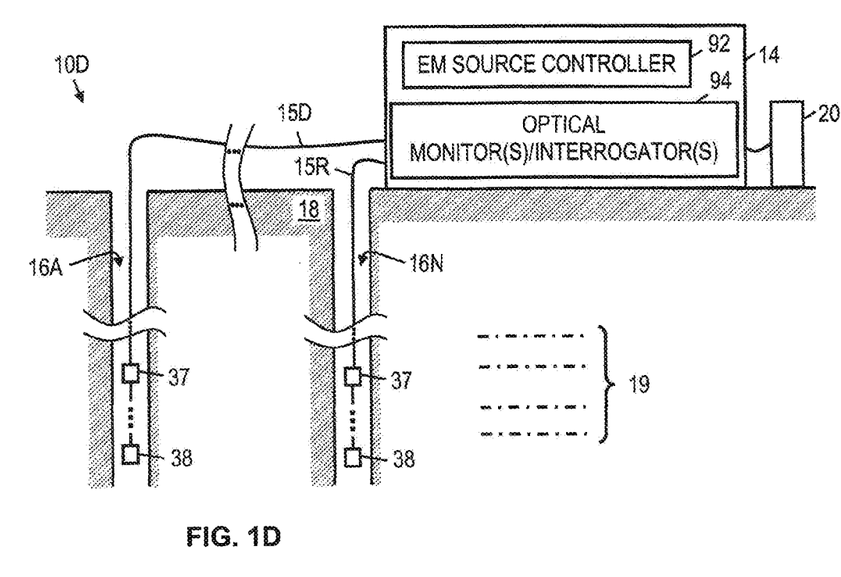

FIG. 1D shows a multi-well survey environment 10D, in which optical magnetic field sensor units 38 and EM sources 37 are distributed in multiple boreholes 16A-16N that penetrate formations 19 of the earth 18. The optical magnetic field sensor units 38 and EM sources 37 may be positioned in the boreholes 16A-16N via LWD operations (see e.g., FIG. 1A), wireline logging operations (see e.g., FIG. 1B), and/or permanent well installations (see e.g., FIG. 1C). For each of the boreholes 16A-16N, corresponding cables 15D-15R enable monitoring or interrogation of the optical magnetic field sensor units 38. Further, the cables may convey power and/or communications to EM sources 37 or other downhole components. At earth's surface, surface interface(s) 14 couple to the cables 15D-15R to receive the magnetic field measurements from the optical magnetic field sensor units 38 and to convey the magnetic field measurements to computer system 20, where analysis operations including cross-well analysis are performed.

In at least some embodiments, the surface interface(s) 14 may include an EM source controller 92 to direct the operations of EM sources 37. Further, the surface interface(s) may include optical monitor(s)/interrogator(s) 94. For optical monitoring operations, light beams generated by the optical magnetic field sensor units 38 in presence of a magnetic field (a source light beam is not needed) are collected and stored by the optical monitor(s)/interrogator(s) 94. Meanwhile, for optical interrogation operations, source light beams from the optical monitor(s)/interrogator(s) 94 are provided to the optical magnetic field sensor units 38. Such source light beams are modulated by the optical magnetic field sensor units 38 in presence of a magnetic field, and the modulated source light beams are collected and stored. For multiplexed optical signals, additional processing is performed by the optical monitor(s)/interrogator(s) 94 to correlate received optical signals with particular optical magnetic field sensor units 38. Examples of multiplexing options that may be used for optical monitoring or optical interrogation operations include time-division multiplexing (TDM), wavelength division multiplexing (WDM), and mode division multiplexing (MDM).

Figure 2A:
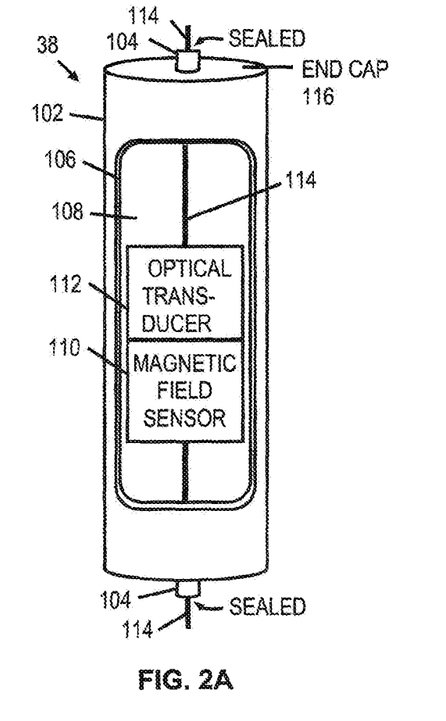
FIGS. 2A-2B show illustrative views of an optical magnetic field sensor unit.
Figure 2B:
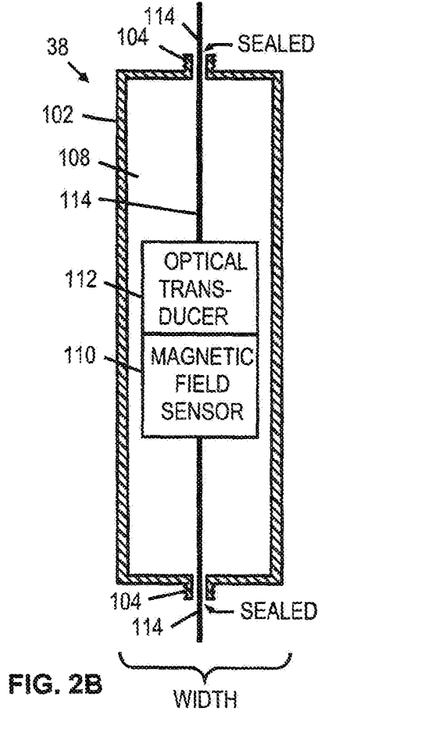

FIG. 2A shows a cutaway view of an optical magnetic field sensor unit 38. Meanwhile, FIG. 2B shows a cross-sectional view of the optical magnetic field sensor unit 38. In both views, an optical fiber 114 extends through opposite ends of housing 102. In at least some embodiments, the housing 102 has a hollow cylindrical shape as shown, although other hollow shapes are possible (e.g., rectangular). Within the housing 102, a magnetic field sensor 110 and an optical transducer 112 operate to generate a light beam or to modulate a source light beam in presence of a magnetic field. For example, in one embodiment, the magnetic field sensor 110 and optical transducer 112 correspond to a magnetostrictive component bonded to optical fiber 114. In this configuration, the magnetic field sensor 110 and optical transducer 112 are combined (or the bond between the magnetostrictive component and the optical fiber 114 could be considered an optical transducer). As used herein, the term "bonded" refers to any physical or adhesive-based connection such that deformation of the magnetostrictive component causes a corresponding strain to the optical fiber 114. Using a magnetostrictive component to jacket optical fiber 114 such that the optical fiber 114 is strained in response to deformation of the magnetostrictive component is an example of a suitable bond. The above magnetostrictive configuration is suitable for optical interrogation, where a source light beam in the optical fiber 114 is modulated by the amount of strain applied to the optical fiber 114 by the magnetostrictive component in presence of a magnetic field.

In another embodiment, the magnetic field sensor 110 corresponds to an inductive coil, where a voltage is induced in the coil in presence of a magnetic field. In such case, the optical transducer 112 may correspond to a light-emitting diode (LED) configuration suitable for optical monitoring operations. Alternatively, configurations suitable for optical interrogation operations may employ an optical transducer 112 that modulates a source light beam based on a voltage induced in a coil by a magnetic field. Some example optical transducers 112 suitable for modulating a source light beam based on an induced voltage include: 1) a piezoelectric component bonded to a fiber laser; 2) a hinged reflective surface; 3) a piezoelectric component that bends or strains an optical fiber; 4) an optical resonator; and 5) a lithium niobate modulator.

When assembling an optical magnetic field sensor unit 38, the housing 102 may have at least two parts. For example, one of the ends of the housing 102 may initially be open to allow the magnetic field sensor 110, the optical transducer 112, and the optical fiber 114 to be positioned inside the housing 102. Once the magnetic field sensor 110, the optical transducer 112, and the optical fiber 114 are positioned as desired, an end cap 116 with a hole for the optical fiber 114 and/or connector 104 is added to cover the open end of the housing 102. The end cap 116 may be coupled to the rest of the housing 102 using welds, threads, adhesive, etc.

In at least some embodiments, the housing 102 provides space 108 around the magnetic field sensor 110 and/or optical transducer 112 so that the magnetic field sensor 110 and/or optical transducer 112 are free to deform in presence of a magnetic field. Without limitation to other embodiments, an example optical magnetic field sensor unit 38 has a maximum width of about 1 inch, a housing thickness of about 2 mm, and a maximum length of about 4 inches. A plurality of such optical magnetic field sensor units 38 may be added (e.g., via splicing) to a tubing encapsulated cable (TEC), which typically have an outer diameter of approximately 1 cm. When assembly is complete, a modified TEC with distributed optical magnetic field sensor units 38 may be deployed in a survey environment as described herein.

It should be appreciated that the orientation of the magnetic field sensor 110 and the optical transducer 112 in housing 102 may vary to detect different magnetic field components. Further, multiple magnetic field sensors 110 and optical transducers 112 may reside within a housing 102. In other words, each optical magnetic field sensor unit 38 can be constructed to measure one, two, or three directional components of a magnetic field.

When a plurality of optical magnetic field sensor units 38 are distributed in a downhole environment, the sensor units 38 may be positioned to improve directional sensitivity with respect to the formation resistivity, e.g., to emulate vertical and/or horizontal magnetic dipole receivers. Further, multiple optical magnetic field sensor units 38 may be collocated about a common point to improve sensitivity to the formation resistivity. When multiple magnetic field sensors 110 and optical transducers 112 are placed within a single sensor unit housing, the component orientation (e.g., orthogonal, collinear) and/or position (e.g., staggered) may vary to derive more diverse spatial information about the magnetic field, i.e., multicomponent measurements of the field. Compact arrangements for multiple optical magnetic field sensor units 38 are possible when a single housing is used. Further, it should be appreciated that the spacing between optical magnetic field sensor units 38 is arbitrary, and may be chosen for specific sense operations based on prior analysis not limited to frequency, depth of investigation, target, receiver arrays, etc.

In at least some embodiments, the housing 102 includes connectors 104 at opposite ends where the optical fiber 114 extends through the housing 102. For example, the connectors 104 may be part of the housing and/or end caps 116. Alternatively, the connectors 104 may be added to end cap 116 using welds, threads, adhesive, sealants, etc. The connectors 104 enable an optical magnetic field sensor unit 38 to couple to a cable (e.g., cable 15). As an example, the connector 104 may be threaded or otherwise configured to mate with a corresponding connector of a cable. In addition, the optical fiber 114 extending from the housing 102 at opposite ends may be spliced with optical fibers of a cable to form a continuous optical waveguide. Available splicing techniques may be employed to create a fiber optic cable (e.g., cable 15) with a plurality of such sensor units 38 distributed along the length of the cable.

In the embodiments of FIGS. 2A and 2B, the sensor unit 38 is sealed at the opposite ends, where the optical fiber 112 extends through the housing 102 and connectors 104. The seal may be provided by an epoxy or other sealant. Within the sealed housing 102, a fluid may occupy space 108. For example, the fluid may be inserted into the housing once the housing 102 and connectors 104 are in place and before all the seals are complete (e.g., one seal may be left unfinished until the fluid has be inserted into the housing 102. Once the fluid has filled the available space 108, the housing 102 is completely sealed to prevent the fluid from leaking out of the housing 102. In at least some embodiments, the fluid in space 108 corresponds to a chemically inert (non-corrosive), non-magnetic, electrically insulating fluid such as air. In other embodiments, the fluid in space 108 corresponds to a chemically inert, non-magnetic, electrically insulating, non-compressible fluid to provide further structural resilience to high pressure such as distilled water. In yet another embodiment, the fluid in space 108 corresponds to a chemically inert magnetic fluid such as ferrofluids. The magnetic fluid enhances the magnetic permeability inside the housing 102, which increases the response of the magnetostrictive component 110 in presence of a magnetic field.

In different embodiments, the material(s) and thickness of the housing 102 may vary. In at least some embodiments, the housing 102 is configured to satisfy at least one of a predetermined temperature criterion, a predetermined pressure criterion, a predetermined corrosion resistance criterion, a predetermined size criterion, and a predetermined electromagnetic transmissibility criterion, though in at least some embodiments each of these are satisfied to support operation in hostile downhole environments.

For example, with regard to the predetermined temperature criterion and pressure criterion, at least some housing embodiments enable sense operations at ambient temperatures greater than 175° C. and at ambient pressures greater than 35,000 psi. Further, the housing 102 should have high tensile and compressive strength to withstand high pressures and shearing forces due to fluid pumping (e.g., during cementing).

With regard to the corrosion resistance criterion, at least some housing embodiments are comprised of material(s) resistant to corrosion during standard well completion practices, including cementation, stimulation (e.g., steam injection, acidization), hydraulic fracturing. With regard to the predetermined size criterion, the housing 102 may have a width of less than 1 inch (2.54 cm) and preferably less than 0.5 inches (1.27 cm). The predetermined size criteria may vary depending on how the sensor unit 38 is to be deployed in a downhole environment. For example, if the sensor unit 38 is to be deployed in the space between a casing and a borehole wall, then the gap (annulus) between the borehole wall and the casing may be used to determine the size criteria for housing 102. More specifically, if a 9⅝" (24.4 cm) casing is emplaced in a 12¼" (31.1 cm) borehole, the annulus provides less than 1.5" (3.81 cm) of space between the casing and the borehole wall. Further, the annulus should not be restricted so as to ensure reliable cementation and prevention of any structural weaknesses and/or fluid conduits. In the above example, the housing 102 for a sensor unit 38 deployed between the 9⅝" (24.4 cm) casing and the 12¼" (31.1 cm) borehole should be less than 0.5" (1.27 cm) in width.

With regard to the electromagnetic transmissibility criterion, the housing 102 should be electromagnetically compatible with sense operations. This electromagnetic transmissibility criterion implies that the sensor unit housing should not significantly attenuate the EM field being measured, typically between 1 Hz and 10 kHz. Otherwise, the sensor unit 38 would fail as a sensor, or at least suffer in performance. Further, the material(s) for housing 102 would be electrically resistive if not insulating to not significantly attenuate the EM field being measured. The electromagnetic transmissibility is a measure of the transmission of an EM field through the housing 102 relative to the EM field that would be measured in the absence of the housing 102. To a first approximation, the electromagnetic transmissibility of the packaging can be estimated from the amplitude attenuation of a plane wave incident upon a layer of packaging material with thickness equal to the packaging material thickness required to withstand pressures of 35,000 psi. Table 1 presents a summary of electromagnetic transmissibility at different frequencies for a variety of potential materials for housing 102.

TABLE 1

| Material | | Thickness (mm) | EM Transmissibility (%) | | |
|---|---|---|---|---|---|
| | | | 100 Hz | 1 kHz | 10 kHz |
| Fiber optic tubing encapsulated cable (TEC) materials | SS316 | 7 | 85 | 60 | 20 |
| | Incoloy 825 | 9 | 84 | 59 | 18 |
| | Inconel 625 | 6.8 | 89 | 69 | 30 |
| | Inconel 718 | 2 | 96.5 | 89 | 70 |
| | MP35N | 5.2 | 90.5 | 73 | 37 |
| | Incoloy 925 | 2.8 | 95 | 85 | 60 |
| Non-magnetic metal alloys | Nitronic 50/60 | 5.5 | 90 | 75 | 40 |
| | Monel K500 | 3.9 | 92 | 78 | 45 |
| | Inconel 725 | 2 | 96 | 89 | 70 |
| | BeCu | 1.7 | 89 | 69 | 32 |
| Non-metals | PEEK | 16 | 99.99 | 99.99 | 99.99 |

As shown in Table 1, several potential materials for housing 102 can satisfy the pressure criterion (tensile and compressive strength) and electromagnetic transmissibility criterion. As examples, the housing 102 can be fabricated from Inconel 725, BeCu, Inconel 718, or Incoloy 925. The latter two are the same materials used to fabricate fiber optic TECs, and thus are relatively low cost.

The electromagnetic transmissibility of a housing 102 can be evaluated using three-dimensional (3 D) numerical simulations. In an example simulation, the vertical component of the magnetic field was simulated in a housing 102 due to a vertical magnetic dipole with unit moment located 30 ft below the sensor unit 38. Further, the relative permeability of the magnetic fluid was assumed to be 10. The vertical component of the magnetic field due to the same transmitter was also simulated at the same location but in the absence of the sensor unit housing. In both instances, the formation was assumed to be a 10 ohm-m whole-space. Simulation results with or without magnetic fluids in the housing 102 are provided below.

Figure 3A:
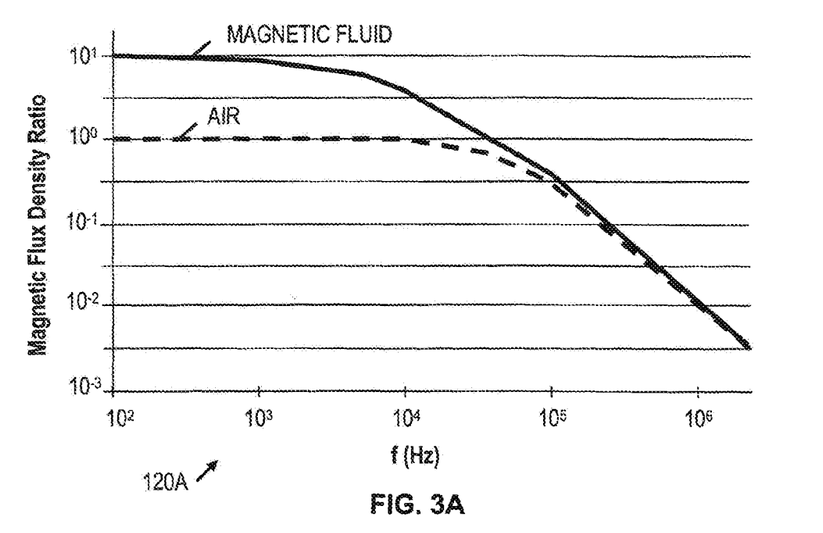
FIG. 3A-3C show charts of simulation results for magnetic flux density within a sensor unit housing as a function of frequency for different housing materials.
Figure 3B:
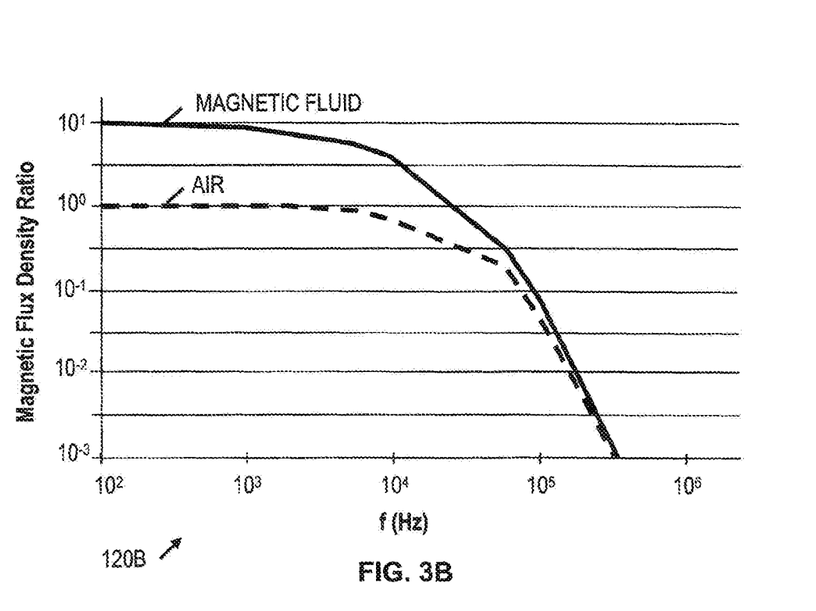
Figure 3C:
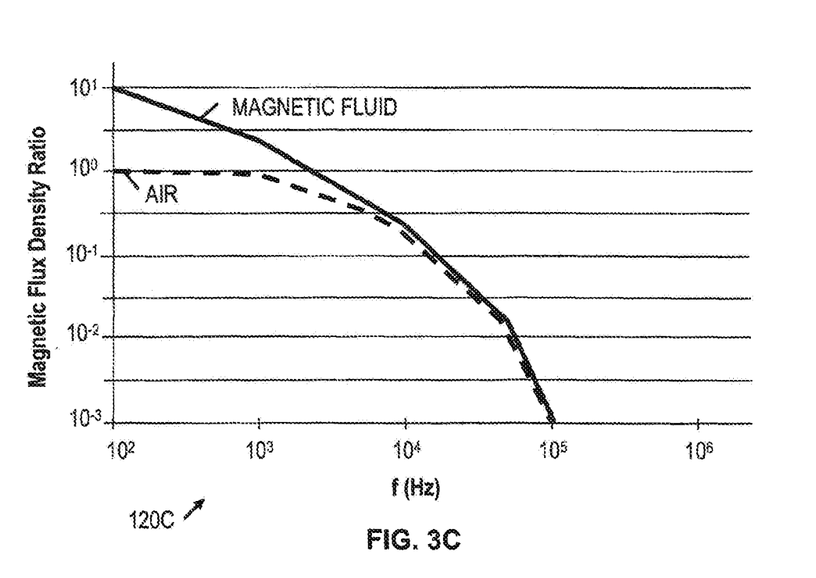

FIG. 3A-3C show charts 120A-120C of simulation results for magnetic flux density within a housing 102 as a function of frequency for different housing materials. More specifically, the housing material for chart 120A of FIG. 3A is Inconel, the housing material for chart 120B of FIG. 3B is Nitronic 50, and the housing material for chart 120C of FIG. 3C is BeCu. In charts 120A-120C, the magnetic flux density varies across a frequency range of 100 Hz to 1 MHz normalized to the magnetic flux density in the absence of a housing 102. For each housing material, the housing 102 was filled with either air or a magnetic fluid. The wall thickness specified in Table I was used such that each housing 102 was pressure rated to 35,000 psi.

As shown in charts 120A-120C, the attenuation varies with the material used for the housing 102. For Inconel (chart 120A), no significant attenuation occurs below 10 kHz. For Nitronic 50 (chart 120B), no significant attenuation occurs below 5 kHz. For BeCu (chart 120C), no significant attenuation occurs below 1 kHz. Further, charts 120A-120C show the presence of magnetic fluid in the housing 102 increases the magnetic flux density compared to an air-filled housing.

In accordance with at least some embodiments, the sensor unit(s) 38 can be deployed directly upon steel casing without the need for any type of electrical insulation of the steel casing. Further, sensor unit(s) 38 can be deployed upon non-metallic (e.g., fiber glass) casing. The housing 102 can be shaped such it minimizes exposure to shear forces and drag resistance against fluid flow, e.g., during cementation.

In at least some embodiments, the sensor unit(s) 38 can be fabricated in such a manner to enable efficient mass production and ease of deployment as part of a permanent EM monitoring system. For example, the sensor unit(s) 38 and correspond cable (e.g., cable 15) can be pre-fabricated in a factory and delivered on a cable reel (e.g., reel 54) for ease of deployment at the well site during the completion of a well. A magnetic field monitoring system employing sensor unit(s) 38 can be simultaneously deployed with other fiber optic-based sensors including, but not limited to, acoustic sensors, temperature sensors, pressure sensors, strain sensors, chemical sensors, current sensors and/or electric field sensors.

Figure 4:
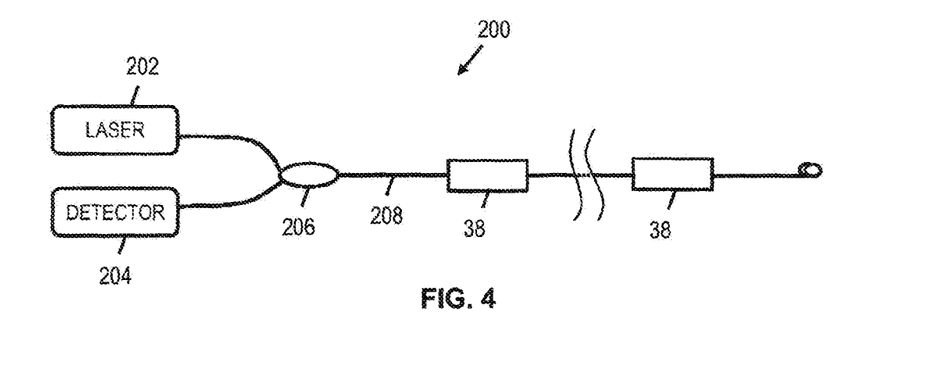
FIG. 4 shows an illustrative optical interrogation system.

As previously mentioned, a plurality of magnetic field sensor units 38 can be deployed along the same optical fiber and interrogated or monitored through at least one method of multiplexing. FIG. 4 shows an illustrative optical interrogation system 200. In system 200, various optical magnetic field sensor units 38 are distributed along optical fiber(s) 208 or a corresponding cable (e.g., cable 15). The optical fiber(s) 208 is coupled to a laser 202 and a detector 204 via a coupler 206. In at least some embodiments, the laser 202 and the detector 204 are part of a surface interface 14 (see e.g., FIGS. 1A-1D). In operation, the magnetic field sensor units 38 modulate source light beams emitted by the laser 202 in accordance with a magnetic field at the location of each of the sensor units 38. The detector 204 receives the modulated source light beams and recovers magnetic field measurements. The laser 202, the detector 204, the sensor units 38, and/or the optical fiber(s) 208 may be configured for multiplexing options such as TDM, WDM, and/or MDM. In principle the number of optical magnetic field sensor units 38 in system 200 is only limited by the attenuation of light propagating along the optical fiber(s) 208. Certain contemplated embodiments include hundreds of optical magnetic field sensor units 38 along a given optical fiber 208.

Figure 5:
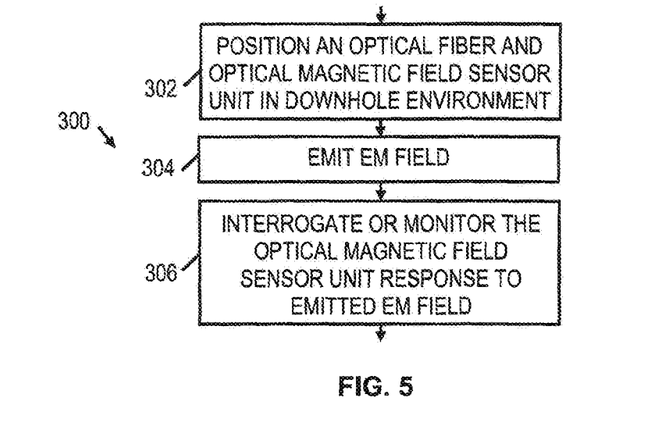
FIG. 5 shows an illustrative magnetic field measurement method for a downhole environment.

FIG. 5 is a flowchart of an illustrative magnetic field monitoring method 300. In method 300, an optical fiber (e.g., an optical fiber within cable 15, optical fiber 114, or optical fiber 208) and optical magnetic field sensor units (e.g., sensor units 38) are positioned in a downhole environment (block 302). For the example, the positioning of the optical fiber and the optical magnetic field sensor units may correspond to temporarily positioning the optical fiber and the optical magnetic field sensor units in a downhole position using a LWD tool (e.g., tool 36) or wireline tool string (e.g., string 60). For example, the optical fiber and optical magnetic field sensor units may be integrated with a LWD or wireline tool or at least attached to a LWD or wireline tool. Alternatively, the positioning of the optical fiber and the optical magnetic field sensor units may correspond to permanently positioning the optical fiber and the optical magnetic field sensor units as part of a well installation (e.g., a production well such as well 70, an injection well, or a monitoring well). In at least some embodiments, the optical fiber used for monitoring or interrogating optical magnetic field sensor units is part of a sensing cable such as a TEC with optical magnetic field sensor units distributed along the TEC. For example, the sensing cable may be strapped to a casing string (e.g., casing string 72) as the casing string is assembled and lowered into a borehole before being cemented in place. The installation crew may further complete the well, performing any needed perforation, treatment, equipping, and conditioning operations to optimize production. The well may alternatively be an injection well or a "dry well" created solely for monitoring downhole parameters of interest.

At block 304, an EM field is emitted from an EM source (e.g., EM source 37). The EM source may be in the downhole environment or at earth's surface. Interrogation or monitoring of an optical magnetic field sensor unit in response to the emitted EM field is performed at block 306. In at least some embodiments, the monitoring or interrogation operations of block 306 may involve emitting a source light beam that is modulated by optical magnetic field sensor units in presence of a magnetic field. The modulated source light beam returns to earth's surface, where the corresponding magnetic field information is recovered. In other embodiments, the optical magnetic field sensor units generate a light beam (a source light beam is not needed) in presence of a magnetic field. In such case, light beams generated by deployed optical magnetic field sensor units can be monitored without interrogation to recover corresponding magnetic field measurements. When multiple optical magnetic field sensor units are deployed, one or more multiplexing options may be employed to distinguish between the magnetic field measurements corresponding to different optical magnetic field sensor units. The measurements recovered from the optical magnetic field sensor units are processed, for example, to derive logs of magnetic fields in a downhole environment. Further, magnetic field measurement logs may be used to derive other downhole parameters such as formation impedance, fluid front distance, etc., which are then displayed to a user.

The disclosed sensor units 38 and related methods and systems have low power requirements, making them compliant with various oilfield-related electrical standards including IWIS and particularly suitable for offshore well environments having limited available power from subsea installations. Some disclosed magnetic field monitoring embodiments require no downhole power consumption at all. In at least some embodiments, optical interrogation or monitoring components may be located downhole and powered from batteries, downhole turbines, or other integrated power sources. The disclosed magnetic field monitoring systems are also suitable for use in acidic or basic high pressure (e.g., 35,000 psi) and high temperature (e.g., >260° C.) environments and can tolerate continuous vibration over an extended period.

For EM sources, any suitable antenna configuration may be used including one or more electric monopoles, electric dipoles, magnetic dipoles, and combinations thereof. Typically, EM source configurations using multiple antennas would locate the various antennas at different locations, though some embodiments may employ multiple collocated dipole antennas for multi-component field measurements. Some magnetic field monitoring method and system embodiments may omit the antenna-based EM sources in favor natural EM sources such as telluric currents or spontaneous potentials.

Embodiments disclosed herein include:

A: A magnetic field sensor unit for a downhole environment, where the sensor unit comprises an optical fiber, a magnetic field sensor, an optical transducer, and a sealed housing that encloses the magnetic field sensor and the optical transducer. The optical transducer is configured to generate a light beam or modulate a source light beam in the optical fiber in response to a magnetic field sensed by the magnetic field sensor.

B. A magnetic field measurement system for a downhole environment, where the system comprises an electromagnetic source to emit an electromagnetic field. The system also comprises an optical fiber and an optical magnetic field sensor unit positioned in the downhole environment, wherein the optical magnetic field sensor unit comprises a sealed housing that encloses a magnetic field sensor and an optical transducer. The system also comprises a remote interrogation or monitoring unit coupled to the optical fiber to obtain a magnetic field measurement from the optical magnetic field unit due to the emitted electromagnetic field.

C: A magnetic field measurement method for a downhole environment, where the method comprises positioning an optical fiber and an optical magnetic field sensor unit in the downhole environment, wherein the optical magnetic field sensor unit comprises a sealed housing that encloses a magnetic field sensor and an optical transducer. The method also comprises emitting an electromagnetic field. The method also comprises interrogating or monitoring an output of the optical magnetic field sensor unit to obtain a magnetic field measurement due to the emitted electromagnetic field.

Each of the embodiments, A, B, and C, may have one or more of the following additional elements in any combination. Element 1: the housing is filled with a fluid that is non-magnetic, electrically insulating, and chemically inert. Element 2: the housing is filled with a fluid that is non-compressible. Element 3: the housing is filled with a fluid that enhances magnetic flux density inside the housing in presence of a magnetic field. Element 4: the housing includes connectors at opposite ends of the housing for coupling the sensor to a fiber optic cable. Element 5: further comprising a plurality of magnetic field sensors and corresponding optical transducers having different orientations within the housing. Element 6: the housing is configured to withstand operating temperatures greater than 175° C. and operating pressures greater than 35,000 psi. Element 7: the housing resists corrosion from cementation, steam injection, acidization, and hydraulic fracturing. Element 8: the housing has a maximum width of less than 1 inch. Element 9: the housing is made from an Inconel material or an Incoloy material.

Element 10: further comprising a LWD tool or wireline tool string associated with the optical magnetic field sensor unit to adjust a position of the optical magnetic field sensor unit in the downhole environment. Element 11: further comprising a permanent well casing associated with the optical magnetic field sensor unit to maintain a permanent position of the optical magnetic field sensor unit in the downhole environment. Element 12: further comprising a plurality of optical magnetic field sensor units, each sensor unit having a housing that encloses a magnetic field sensor and an optical transducer, wherein the plurality of optical magnetic field sensor units are distributed in a single well or in multiple wells. Element 13: further comprising a computer that receives and processes measurements corresponding to one or more optical magnetic field sensor units to generate a log for display. Element 14: the interrogation or monitoring unit emits a light beam along the optical fiber and monitors phase changes in the light beam caused by one or more optical magnetic field sensor units distributed along the optical fiber. Element 15: the housing has a maximum width of less than 1 inch and is configured to withstand operating temperatures greater than 175° C. and operating pressures greater than 35,000 psi.

Element 16: positioning an optical fiber and an optical magnetic field sensor unit in the downhole environment comprises temporarily positioning the optical magnetic field sensor unit using a LWD string or wireline tool string. Element 17: positioning an optical fiber and an optical magnetic field sensor unit in the downhole environment comprises permanently positioning the optical magnetic field sensor unit as part of a permanent well installation. Element 18: the housing has a maximum width of less than 1 inch and is made from at least one of an Inconel material and an Incoloy material.

Numerous variations and modifications will become apparent to those skilled in the art once the above disclosure is fully appreciated. For example, the figures show magnetic field monitoring configurations suitable for reservoir monitoring (e.g., in response to enhanced oil recovery operations or steam assisted gravity drainage), but they are also readily usable for treatment operations, cementing operations, and $CO_2$ or wastewater sequestration monitoring. Further, while the disclosed embodiments describe optical magnetic field sensor units, it should be appreciated that the disclosed housing variations could be applied to non-optical downhole magnetic field sensor units (e.g., sensors that generate an electrical signal or modulate a source electrical signal in presence of a magnetic field). In such case, the sensor units may be distributed along one or more electrical conductors (e.g., in the survey environments of FIGS. 1A-1D). Suitable interrogation, monitoring, and/or signal multiplexing techniques could be applied to non-optical downhole magnetic field sensor units distributed along one or more electrical conductors. The ensuing claims are intended to cover such variations where applicable.

What is claimed is:

1. A system for a downhole environment, the system comprising:
   a casing string; and
   a sensor unit comprising:
      an optical fiber;
      a magnetic field sensor;
      an optical transducer; and
      a sealed housing filled with magnetic fluid, wherein the magnetic fluid encloses the magnetic field sensor and the optical transducer, wherein the sealed housing is made of a material with an electromagnetic transmissibility of at least 69 percent for a frequency range at or below 1 kHz across the sealed housing filled with the magnetic fluid,
   wherein the sensor unit is positioned along an outer surface of the casing string to allow for detection, by the magnetic field sensor, of a magnetic field which has passed through a formation within the downhole environment,
   wherein the optical transducer is configured to generate a light beam or to modulate a source light beam in the optical fiber based on the magnetic field detected by the magnetic field sensor.

2. The system of claim 1, wherein the magnetic fluid inside the sealed housing is a fluid that enhances magnetic flux density inside the sealed housing in presence of a magnetic field.

3. The system of claim 1, wherein the sealed housing includes connectors at opposite ends of the sealed housing for coupling the sensor unit to a fiber optic cable.

4. The system of claim 1, further comprising a at least a second magnetic field sensor and at least a second optical transducer, wherein the magnetic field sensors have different orientations within the sealed housing.

5. The system of claim 1, wherein the sealed housing is configured to withstand operating temperatures greater than 175° C. and operating pressures greater than 35,000 psi.

6. The system of claim 1, wherein the sealed housing resists corrosion from cementation, steam injection, acidization, and hydraulic fracturing.

7. The system of claim 1, wherein the sealed housing has a maximum width of less than 1 inch.

8. The system of claim 1, wherein the sealed housing is made from an Inconel material or an Incoloy material.

9. The system of claim 1, wherein the material is at least one of a fiber optic tubing encapsulated cable and a non-magnetic metal alloy.

10. A magnetic field measurement system for a downhole environment, the system comprising:
- an electromagnetic source to emit an electromagnetic field into a formation;
- a sensor unit comprising a magnetic field sensor and an optical transducer enclosed in a sealed housing filled with magnetic fluid, wherein the magnetic fluid encloses the magnetic field sensor and the optical transducer, and wherein the sensor unit is positioned along an outer surface of a casing string to allow for detection, by the magnetic field sensor, of the electromagnetic field, wherein the sealed housing is made of a material with an electromagnetic transmissibility of at least 69 percent for a frequency range at or below 1 kHz across the sealed housing filled with the magnetic fluid;
- an optical fiber coupled to the sensor unit; and
- a remote interrogation unit coupled to the optical fiber to obtain a magnetic field measurement from the sensor unit due to the emitted electromagnetic field.

11. The system of claim 10, wherein the sensor unit is attached to a first casing in the casing string to maintain a permanent position of the sensor unit in the downhole environment.

12. The system of claim 10, wherein the remote interrogation unit emits a source light beam along the optical fiber and monitor phase changes in the source light beam caused by the optical transducer.

13. The system of claim 10, wherein the sealed housing has a maximum width of less than 1 inch and is configured to withstand operating temperatures greater than 175° C. and operating pressures greater than 35,000 psi.

14. A magnetic field measurement method for a downhole environment, the method comprising:
- positioning a sensor unit coupled to an optical fiber along an outer surface of a casing in the downhole environment, wherein the sensor unit comprises a sealed housing filled with magnetic fluid, wherein the magnetic fluid encloses a magnetic field sensor and an optical transducer, wherein the sealed housing is made of a material with an electromagnetic transmissibility of at least 69 percent for a frequency range at or below 1 kHz across the sealed housing filled with the magnetic fluid;
- emitting an electromagnetic field into a formation in the downhole environment; and
- interrogating or monitoring an output of the sensor unit to obtain a magnetic field measurement related to the formation due to the emitted electromagnetic field.

15. The method of claim 14, wherein said positioning comprises permanently positioning the sensor unit to the casing using one or more bands as part of a permanent well installation comprising the casing.

16. The method of claim 14, wherein the sealed housing has a maximum width of less than 1 inch and is made from at least one of an Inconel material and an Incoloy material.

* * * * *